United States Patent
Dankert et al.

(10) Patent No.: US 7,209,394 B1
(45) Date of Patent: Apr. 24, 2007

(54) MEMORY STRUCTURE FOR PROVIDING DECREASED LEAKAGE AND BIPOLAR CURRENT SENSITIVITY

(75) Inventors: Floyd L. Dankert, Austin, TX (US); Scott C. Johnson, Round Rock, TX (US); David R. Reebel, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 65 days.

(21) Appl. No.: 11/221,637

(22) Filed: Sep. 8, 2005

(51) Int. Cl.
*G11C 7/10* (2006.01)

(52) U.S. Cl. .................. 365/189.02; 365/230.02; 365/203; 365/189.11

(58) Field of Classification Search .......... 365/189.02, 365/230.02, 203, 189.11
See application file for complete search history.

(56) References Cited

U.S. PATENT DOCUMENTS

| | | | |
|---|---|---|---|
| 5,615,144 A * | 3/1997 | Kimura et al. ............ 365/145 |
| 6,683,805 B2 * | 1/2004 | Joshi et al. ............... 365/156 |
| 6,952,377 B2 | 10/2005 | Chung | |
| 6,957,372 B2 | 10/2005 | Barth, Jr. et al. | |
| 6,958,931 B1 | 10/2005 | Yoon | |

* cited by examiner

*Primary Examiner*—Anh Phung
*Assistant Examiner*—N Nguyen
(74) *Attorney, Agent, or Firm*—Meyertons Hood Kivlin Kowert & Goetzel, P.C.; B. Noël Kivlin; Erik Heter

(57) ABSTRACT

A memory circuit. In one embodiment, the memory circuit includes a first one-hot multiplexer having a first plurality of local bitlines and a second one-hot multiplexer having a second plurality of local bitlines. Each of the first and second pluralities of local bitlines includes is coupled to a memory cell, and includes a passgate arranged on its respective local bitline to allow access to the cell. The first one-hot multiplexer and the second one-hot multiplexer are coupled together such that the highest order local bitline (i.e. corresponding the highest order bit in the group) is coupled to the lowest order bitline of the second one-hot multiplexer, and vice-versa.

27 Claims, 4 Drawing Sheets

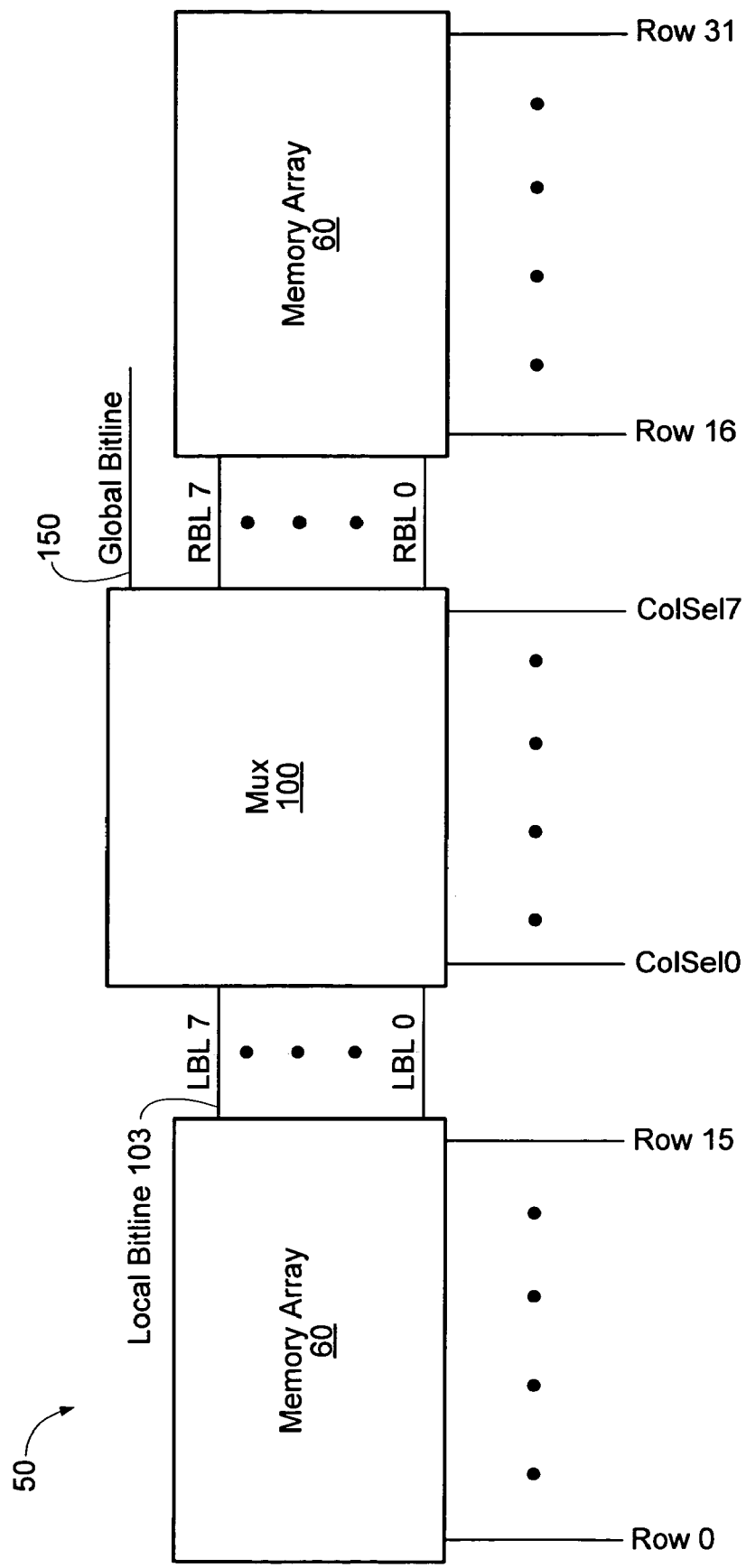

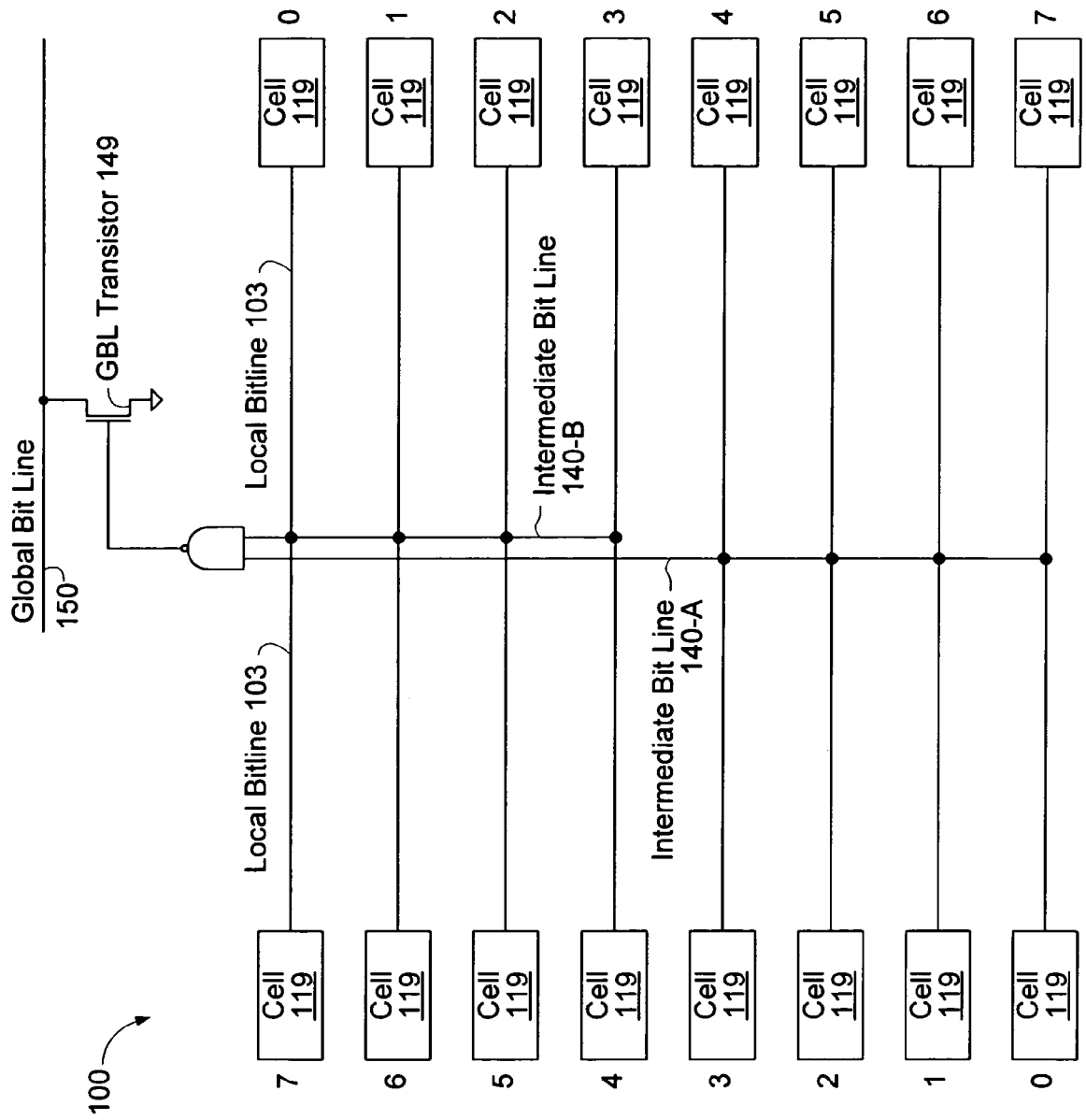

MEMORY STRUCTURE FOR PROVIDING DECREASED LEAKAGE AND BIPOLAR CURRENT SENSITIVITY

BACKGROUND OF THE INVENTION

1. Field of the Invention

This invention relates to electronic systems, and more particularly, to memory devices in electronic systems.

2. Description of the Related Art

Computer systems employ different types of memory for various functions. These types of memory include dynamic random access memory (DRAM), static random access memory (SRAM), and various types of read-only memory (ROM), among others. Many of these types of memories may be implemented using field-effect transistors (FETs), and thus may be subject to certain problems associated therewith.

One problem that may affect FET-based memory circuits is leakage. Leakage can be defined as a zero-signal current flowing across a reverse-biased semiconductor junction. In the case of a FET, this means that some current may be flowing through the drain-source junction even if the transistor is turned off (e.g., when $V_{GS}<V_t$ for an N-channel FET). Leakage currents are undesirable in a memory circuit, as they may cause a loss of information and/or erroneous operation.

Another problem that may affect FET-based memory circuits are bi-polar currents. Bi-polar currents may occur in a FET when the FET operates in the triode region (e.g., $VDS<=VGS-V_t$ in a N-channel FET). Bi-polar currents in a FET-based memory are typically transient currents. However, as with leakage currents, bi-polar currents in a FET-based memory circuit may cause a loss of data or erroneous operation.

Bi-polar and leakage currents may be somewhat reduced by using transistors having larger feature sizes. However, such transistors may have slow switching speeds compared to their smaller counterparts, and thus may be unsuitable for the demands of higher-speed computing systems. Thus, other methods of reducing bi-polar and leakage currents must be found.

FIG. 1 is a schematic diagram of one embodiment of a read-only memory (ROM) structure that illustrates problems associated with leakage and bi-polar currents. More particularly, FIG. 1 illustrates a one-hot multiplexer structure for a plurality of local bitlines that are coupled to a global bitline. Each local bitline is coupled to a ROM cell, which, if programmed to a logic '1' (or logic high level), has a connection broken either on the gate or the drain of the NMOS transistor shown in this example. If no connection is broken, the ROM cell is thus programmed to a logic '0' (or logic low level). If a ROM cell is programmed to a logic high level in this circuit structure, its associated local bitline will tend to float, and will rely on the weak keeper circuit coupled to node A to hold it at a logic high value. As implied by its designation, the keeper circuit is weak in order to enable faster switching speeds.

When one of the passgates in the one-hot multiplexer is turned on, the value present on the local bitline is allowed to propagate through to the inverter and eventually, to the global bitline. While the one passgate is turned on, the remainder of the passgates remain turned off. Thus, the weak keeper circuit must also hold a logic high value on any bitlines associated with a programmed ROM cell since those bitlines are floating, and must also hold a logic high on the selected bitline if its associated cell is programmed. However, due to leakage and bi-polar currents, the keeper circuit (since it is weak), may be unable to hold a logic one on each of the bitlines, including the selected bitline. Thus, the voltage at node A may fall below a value that is recognized by the inverter as a logic '1'. If this happens, the output of the inverter may become a logic high value and thus turn off the two PMOS transistors used in the weak keeper circuit, while also turning on the NMOS transistor coupled to the global bitline. Thus, in this scenario, an incorrect data value may be propagated to the global bitline. While this problem may be mitigated by using a strong keeper circuit, its use may be at the expense of operating speed.

SUMMARY OF THE INVENTION

A memory circuit is disclosed. In one embodiment, the memory circuit includes a first one-hot multiplexer having a first plurality of local bitlines and a second one-hot multiplexer having a second plurality of local bitlines. Each of the first and second pluralities of local bitlines includes is coupled to a memory cell, and includes a passgate arranged on its respective local bitline to allow access to the cell. The first one-hot multiplexer and the second one-hot multiplexer are coupled together such that the highest order local bitline (i.e. corresponding the highest order bit in the group) is coupled to the lowest order bitline of the second one-hot multiplexer, and vice-versa. Similarly, the second highest order bitline of the first plurality may be coupled to the second lowest order bitline of the second plurality, and so forth.

Each local bitline may be coupled to one of a first or second intermediate bitline, which are each coupled to global bitline via a logic circuit an a transistor. A passgate is present on each of the local bitline. The passgate on each local bitline may be activated to allow the contents of a memory cell coupled to the local bitline to be conveyed to the respective intermediate bitline and eventually the global bitline.

In one embodiment, the memory circuit may be a read-only memory (ROM) circuit, and may thus include a ROM cell. The ROM cell may include a transistor and may be programmed to a first value by breaking one or more connections, or may be programmed to a second value by tying the gate terminal such that a transistor is always on. For ROM cells that are programmed to the first value (e.g., a logic high) by breaking one or more connections, a pull-up transistor may be implemented in the cell in order to minimize the effects of leakage currents. In another embodiment, the memory circuit may be a static random access memory (SRAM) or one of several other types of memory circuits.

BRIEF DESCRIPTION OF THE DRAWINGS

Other aspects of the invention will become apparent upon reading the following detailed description and upon reference to the accompanying drawings in which:

FIG. 2A is a block diagram of one embodiment of a memory circuit;

FIG. 2B is a block diagram of a portion of one embodiment of a memory circuit having a plurality of local bitlines operatively coupled t a global bitline;

Figure 1:
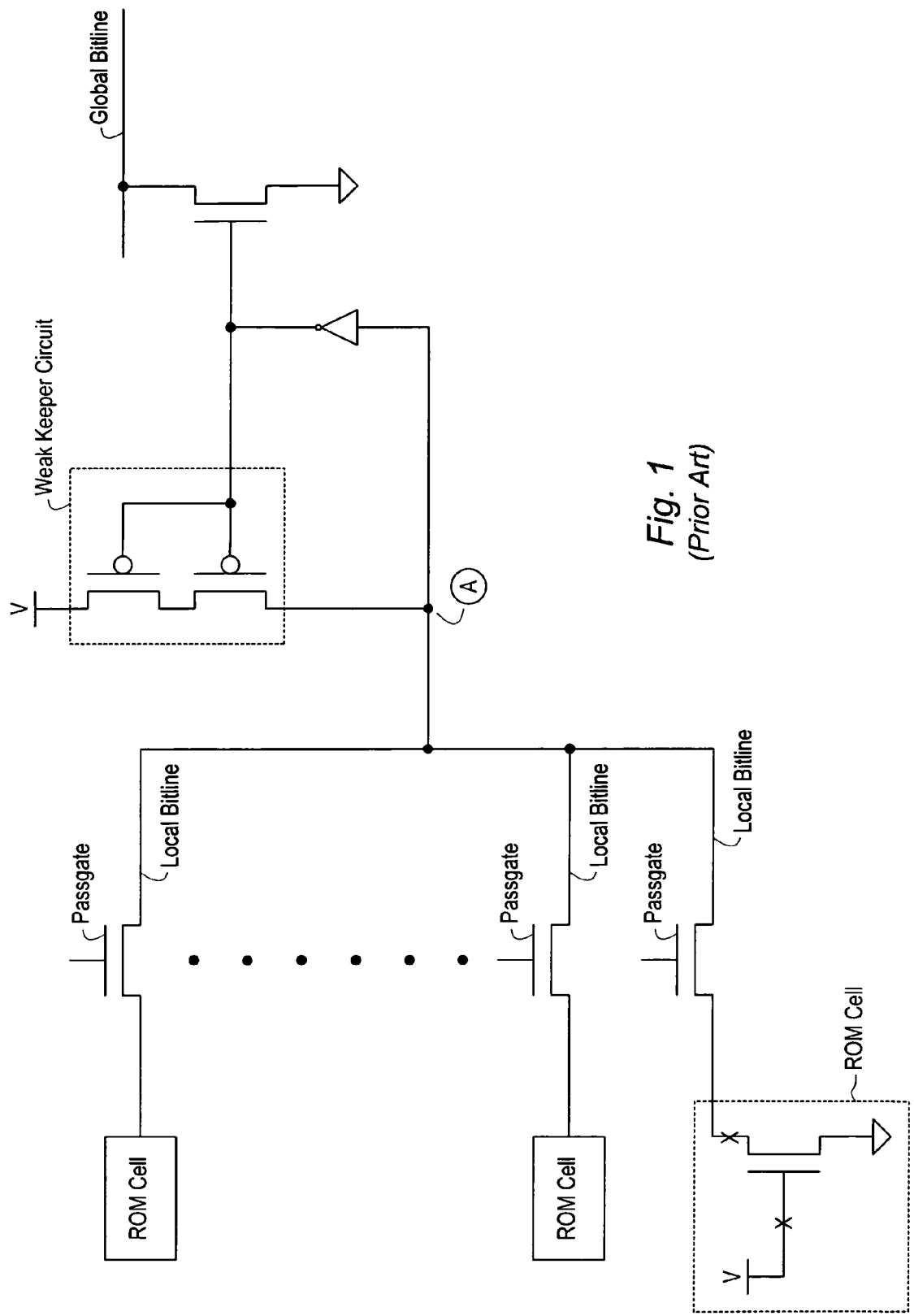
FIG. 1 (Prior Art) is a schematic diagram illustrating one portion of an embodiment of a read-only memory (ROM) circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

FIG. 2A is a block diagram of one embodiment of a memory circuit. In the embodiment shown, memory circuit 50 includes a first memory array 60 and a second memory array 60. Each memory array includes a group of cells, with each of the cells coupled to receive a row signal. In the embodiment shown, memory circuit 50 is a 32-bit memory circuit, with the first array 60 coupled to receive row signals corresponding to rows 0–15 and the second array 60 coupled to receive row signals corresponding to rows 16–31. Each cell is also coupled to a local bitline 103. In the embodiment shown, there are 8 local bitlines 103 coupling each array to multiplexer circuit 100. Column select signals provided to multiplexer 100 provide signals to select a cell by column. Thus, a given cell may be accessed when signals are asserted on both its corresponding row select line and column select line. The value stored in a given memory cell then propagates through multiplexer 100 to global bitline 150. Multiplexer 100 will be discussed in further detail below.

Moving now to FIG. 2B, a block diagram of a portion of one embodiment of a memory circuit having a plurality of local bitlines operatively coupled to a global bitline is shown. In the embodiment shown, memory circuit 50 includes a plurality of memory cells 119, including a first plurality of cells coupled to the local bitlines 103 on the left and a second plurality of cells coupled to the local bitlines 103 on the right. Each of the memory cells may be contained in a memory array such as those discussed above in reference to FIG. 2A. The cells and the local bitlines are arranged such that the highest order cell on the left half of the array is coupled to the lowest order cell on the right half of the array (i.e. the local bitline associated with bit 7 on the left is coupled to the local bitline associated with bit 0 on the right). Similarly, the local bitline associated with bit 7 on the right is coupled to the local bitline associated with bit 0 on the left. Broadly speaking, the cells on the left side are arranged, from top to bottom, in a descending bit order (bit 7 to bit 0), while the cells on the right side are arranged, from top to bottom, in an ascending bit order (bit 0 to bit 7).

Each of the local bitlines is coupled to an intermediate bitline 140, and therefore is operatively coupled to global bitline 150. The local bitlines associated with cells in bit positions 3:0 on the left side and 7:4 on the right side are each coupled to intermediate bitline 140A. The cells associated with bit positions 3:0 on the right side and 7:4 on the left side are associated with intermediate bitline 140B. In general, for other various embodiments of this structure, the lowest order half of cells for a given side (and thus their corresponding local bitlines) are coupled to a first intermediate bitline, while the highest order half of cells for that side are coupled to a second intermediate bitline. For cells on the other side of the circuit structure, the arrangement is reversed, with the higher order cells being coupled to the first bitline and the lower order cells being coupled to the second bitline.

It should be noted that embodiments with a different number of bitlines are possible and contemplated. For example, a memory circuits having 16 or 32 bitlines in each grouping of cells arranged in a manner similar to the embodiment shown in FIG. 2 are possible and contemplated.

Each of the intermediate bitlines coupled to a NAND gate, the output of which is coupled to the gate of global bitline (GBL) transistor 149. The drain terminal of GBL transistor 149 is coupled to global bitline 150, while the source terminal is coupled to a reference (i.e. ground) node. As will be discussed below, each of he local bitlines, the intermediate bitlines, and the global bitline are precharged prior to a read operation. Thus, a default logic '1' is placed on each of the bitlines before any read operation commences. If a logic '1' is read from a selected cell, both inputs to the NAND gate will be a logic '1', and thus the output of the NAND gate will be a logic '0'. A logic '0' on the output of the NAND gate will result in GBL transistor remaining off, and thus the value of a logic '1' remains present on global bitline 150. If a logic '0' is read from a selected cell, one of the inputs to the NAND gate will be a logic '0', and thus, the output of the NAND gate is a logic '1'. The logic '1' on the output of the NAND gate will turn on GBL transistor 149, thereby pulling down the global bitline to a logic '0'.

The portion of the memory circuit shown in FIG. 2 may be one of several different types of memories. In embodiment, the memory may be a read-only memory (ROM), including the various forms of ROM including PROM, EPROM, and EEPROM. The memory circuit may also be a flash memory, a static random access memory (SRAM), or any other type of memory circuit suitable for this type of memory circuit structure.

Figure 3:
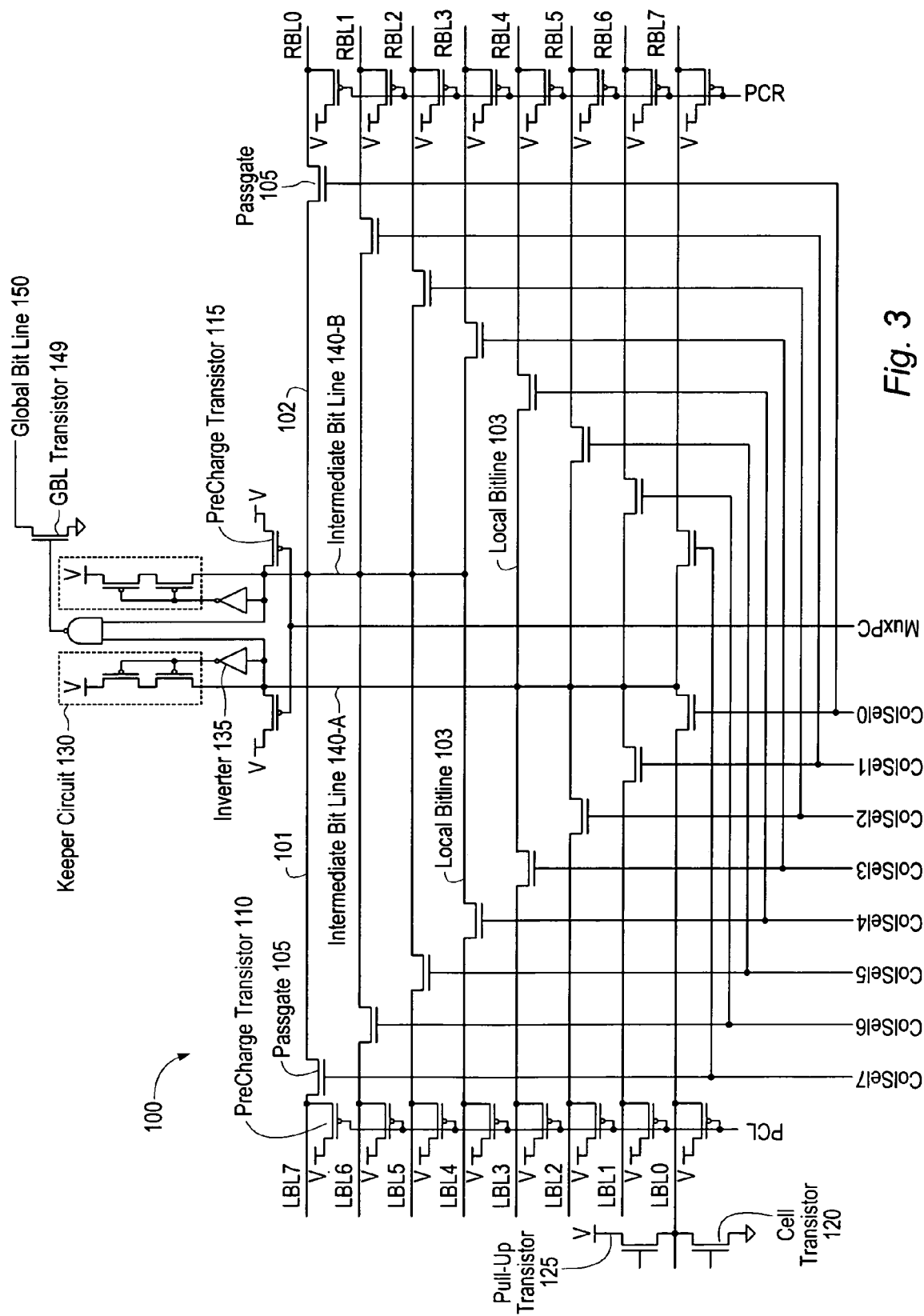
FIG. 3 is a schematic diagram of one embodiment of the memory circuit illustrated in FIGS. 2A and 2B.

Moving now to FIG. 3, a schematic diagram of one embodiment of the multiplexer circuit shown in FIG. 2A is shown. Multiplexer circuit 100 is arranged as a first one-hot multiplexer 101 (left side of drawing) coupled to a second one-hot multiplexer 102 (right side of drawing). Each one-hot multiplexer includes a plurality of local bitlines (LBL 7:0 on the left side, RBL 7:0 on the right side). Each local bitline includes a passgate transistor. Although not explicitly shown for the sake of simplicity, a memory cell is coupled to each of the local bitlines (one cell is shown coupled to LBL 0, which will be discussed below). Each passgate transistor, when activated, allows a logic value held in its respective memory cell to propagate down the local bitline to one of the intermediate bitlines 140.

The local bitlines are arranged in the same manner as those shown in FIG. 2, with a local bitline corresponding to a highest order bit of the first one-hot multiplexer coupled to a local bitline corresponding to a lowest order bit of the second one-hot multiplexer, and so forth. The passgate transistors 105 may each be activated by a column select signal. Each column select signal is coupled to one of the passgates in the first one-hot multiplexer and one of the passgates in the second one-hot multiplexer. Each column select signal corresponds to the bit position of its associated bitline (e.g., bit 7, bit 6, etc.).

A precharge transistor 110 is coupled to each of the local bitlines of both the first and second one-hot multiplexers. The channel of each precharge transistor 110 is coupled between a voltage node V and the local bitline. In the first one-hot multiplexer 101, the gate of each precharge transistor 110 is coupled to receive a precharge signal PCL, while each precharge transistor 110 of the second one-hot multiplexer 102 is coupled to receive a precharge signal PCR. In the embodiment shown, each of the precharge transistors 110 is a PMOS transistor, and thus the precharge signals provided to their respective gate terminals are asserted as a logic '0' (i.e. a logic low voltage). In some embodiments, a common precharge signal may be used for the local bitlines of both one-hot multiplexers. When activated, each precharge transistor couples its respective local bitline to voltage node V, and thus may charge the local bitline to a logic '1' (i.e. a logic high voltage). However, in some embodiments, if the associated memory cell stores a logic '0', the line may not become precharged.

Each of the intermediate bitlines is also coupled to a precharge transistor 115, and may be precharged in the same manner as the local bitlines. A signal MuxPC may be applied to the gate terminal of each of the precharge transistors 115 in order to charge the intermediate bitlines 140A and 140B to a logic '1'. As with the precharge transistors 110, both of the precharge transistors 115 are PMOS transistors, and thus in this particular embodiment the MuxPC signal is asserted as a logic '0'.

Each intermediate bitline 140 is also coupled to a weak keeper circuit 130. In the embodiment shown, each weak keeper circuit 130 includes two PMOS transistors with their gates coupled to a common node. When the transistors of the weak keeper circuits 130 are activated a conductive path exists between the voltage node and the keeper circuit's respective intermediate bitline. Thus, the weak keeper circuits 130 may minimize or eliminate the effects of leakage by helping to keep a logic '1' on their respective intermediate bitlines after precharging. If a memory cell storing a value of logic '0' is selected by one of the column select signals (which thereby activates the passgate transistors 105 on the local bitline associated with the cell to be activated), the logic '0' will propagate to one of the intermediate bitlines 140. A logic '0' on an intermediate bitline will result in the turning off of the transistors of the weak keeper circuit (via an inverter 135 in this particular embodiment).

Like the embodiment of FIG. 2, the embodiment shown in FIG. 3 includes a NAND gate having an output coupled to a global bitline 150. If both inputs to the NAND gate are logic '1's, the output of the NAND gate is a logic '0' and thus GBL transistor 149 remains off. Although not explicitly shown here, global bitline 150 is also coupled to a precharge transistor and is thus subject to a precharge operation. Thus, when GBL transistor 149 remains in an off state, a logic '1' is present on global bitline 150. If one of the inputs to the NAND gate is a logic '0', then the output of the NAND gate will transition to a logic '1', thereby turning on GBL transistor 149 and thus pulling global bitline 150 down to a logic '0'.

As previously mentioned, each local bitline 104 is coupled to a cell in a memory array. In the embodiment shown in FIG. 3, the memory is a ROM and the cell is implemented by a simple cell transistor 125 (shown here for only one local bitline although it is to be understood that a cell is associated with all local bitlines). If the cell is to be programmed to a logic '0', the connections are left intact and cell transistor 120 is energized by a signal on its gate terminal. If the cell is to be programmed to a logic '1', the gate is de-energized, and (in the case where the ROM is not re-programmable), one or more of the connections is broken, thereby allowing a logic '1' to be placed on the respective local bitline by a precharge operation, leakage notwithstanding. In the case where a logic '1' is to be programmed into the cell via cell transistor 120, a pull-up transistor 125 may be implemented to maintain the logic '1' on the respective local bitline 103. The pull-up transistor 125, when activate, may minimize or eliminate the effects of leakage and thereby ensure that a correct value of a logic '1' is read from a cell so programmed.

The circuit discussed above may be effective at reducing the effects of leakage and bi-polar currents. In addition to the presence of an activated pull-up transistor 125 on cells programmed with a logic '1', the arrangement of the connections between the first one-hot multiplexer 102 and the second one-hot multiplexer may also reduce the effects of leakage. Since only four local bitlines are coupled to each intermediate bitline, the number of devices switching against each intermediate bitline is limited. Furthermore, since only one device switches at a time in the one-hot multiplexer structure, the leakage and bipolar currents for each of the remaining three devices coupled to the same intermediate bitline for a given one-hot multiplexer are of concern, in contrast to a standard 8-bit or 16-bit one-hot multiplexer structure. This allows smaller, faster devices to be used in implementing the circuit while also allowing increased tolerance to bi-polar and leakage currents for individual devices. The multiplexer circuit structure is also area efficient due to the symmetry. Since fewer devices are leaking against each intermediate bitline for a given cell access, more memory cells may be coupled to each local bitline, further increasing the area efficiency of the circuit by allowing less area to be consumed for each bit stored.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A memory circuit comprising:
   a first one-hot multiplexer having a first plurality of local bitlines, wherein each of the first plurality of local bitlines includes a passgate;
   a second one-hot multiplexer having a second plurality of local bitlines, wherein each of the second plurality of local bitlines includes a passgate;
   wherein the first one-hot multiplexer and the second one-hot multiplexer are coupled together such that a highest order one of the first plurality of local bitlines is coupled to a lowest order one of the second plurality of local bitlines and wherein a highest order one of the second plurality of local bitlines is coupled to a lowest order one of the first plurality of local bitlines.

2. The memory circuit as recited in claim 1, wherein each of the first and second pluralities of bitlines includes a passgate, each passgate comprising a transistor, and wherein each transistor includes a source terminal coupled to its respective bitline and a drain terminal coupled to its respective bitline such that a channel exists on the bitline through the transistor.

3. The memory circuit as recited in claim 2, wherein each passgate is coupled to receive a column select signal corresponding to its associated local bitline.

4. The memory circuit as recited in claim 1, wherein each of the first and second pluralities of local bitlines is operatively coupled to a global bitline.

5. The memory circuit as recited in 4, wherein:
   a lowest order one half of the first plurality of local bitlines is coupled to a first intermediate bitline;

a highest order one half of the first plurality of local bitlines is coupled to a second intermediate bitline;

a lowest order one half of the second plurality of local bitlines is coupled to the second intermediate bitline; and the highest order one half of the second plurality of local bitlines is coupled to the first intermediate bitline.

6. The memory circuit as recited in claim 5, wherein the first and second intermediate bitlines are coupled to the global bitline by a NAND gate and a transistor.

7. The memory circuit as recited in claim 5 further comprising a first keeper circuit coupled between a voltage node and the first intermediate bitline and a second keeper circuit coupled between the voltage node and the second intermediate bitline.

8. The memory circuit as recited in claim 1 further comprising:
a first plurality of memory cells, wherein each of the first plurality of memory cells is coupled to a corresponding one of the first plurality of local bitlines; and
a second plurality of memory cells, wherein each of the second plurality of memory cells is coupled to a corresponding one of the second plurality of local bitlines.

9. The memory circuit as recited in claim 1 further comprising a first plurality of weak pull-up circuits, wherein one or more of the first plurality of local bitlines is coupled to a corresponding one of the first plurality of weak pull-up circuits; and a second plurality of weak pull-up circuits, wherein one or more of the second plurality of local bitlines is coupled to a corresponding one of the second plurality of weak pull-up circuits.

10. The memory circuit as recited in claim 1 further comprising a first plurality of pre-charge transistors and a second plurality of precharge transistors, wherein a first terminal of each of the first and second pluralities of precharge transistors is coupled to a voltage node.

11. The memory circuit as recited in claim 10, wherein a second terminal of each of the first plurality of precharge transistors is coupled to node corresponding to the second terminal of an associated one of the first plurality of passgate transistors, and wherein a second terminal of each of the second plurality of precharge transistors is coupled to the second terminal of an associated one of the second plurality of passgate transistors.

12. The memory circuit as recited in claim 10, wherein a gate terminal of each of the first plurality of transistors is coupled to receive a first pre-charge signal and wherein a gate terminal of each of the second plurality of transistors is coupled to receive a second pre-charge signal.

13. The memory circuit as recited in claim 1, wherein the memory circuit is comprised in a read-only memory (ROM).

14. The memory circuit as recited in claim 1, wherein the memory circuit is comprised in a static random access memory (SRAM).

15. A memory circuit comprising:
a first plurality of local bitlines and a second plurality of local bitlines, wherein each of the first plurality of local bitlines is coupled to one of the second plurality of bitlines, wherein the first plurality of bitlines is arranged such that a bit order for the first plurality of local bitlines is opposite a bit order for the second plurality of bitlines;
a global bitline operatively coupled to each of the first and second pluralities of local bitlines; and
a multiplexer structure including a first plurality of passgate transistors and a second plurality of passgate transistors, wherein each of the first and second pluralities of passgate transistors includes a first terminal, a second terminal, and a control terminal, wherein the first and second terminals of each of the first plurality of transistors is coupled to one of the first plurality of local bitlines, and wherein the first and second terminals of each of the second plurality of transistors is coupled to one of the second plurality of local bitlines, wherein the first terminal of each of the first plurality of passgate transistors is coupled to one of the first terminals of the second plurality of passgate transistors.

16. The memory circuit as recited in claim 15 further comprising a first plurality of pull-up transistors and a second plurality of pull-up transistors, wherein each of the first and second pluralities of pull-up transistors are arranged such that its channel exists between a voltage node and its associated bitline.

17. The memory circuit as recited in claim 15, further comprising:
a first plurality of memory cells, wherein each of the first plurality of memory cells is coupled to one of the first plurality of bitlines at a node corresponding to the second terminal of an associated one of the first plurality of passgate transistors; and
a second plurality of memory cells wherein each of the second plurality of memory cells is coupled to one of the second plurality of bitlines at a node corresponding to the second terminal of an associated one of the second plurality of passgate transistors.

18. The memory circuit as recited in claim 17, further comprising a first plurality of pre-charge transistors and a second plurality of precharge transistors, wherein a first terminal of each of the first and second pluralities of precharge transistors is coupled to a voltage node.

19. The memory circuit as recited in claim 18, wherein a second terminal of each of the first plurality of precharge transistors is coupled to node corresponding to the second terminal of an associated one of the first plurality of passgate transistors, and wherein a second terminal of each of the second plurality of precharge transistors is coupled to the second terminal of an associated one of the second plurality of passgate transistors.

20. The memory circuit as recited in claim 18, wherein a gate terminal of each of the first plurality of transistors is coupled to receive a first pre-charge signal and wherein a gate terminal of each of the second plurality of transistors is coupled to receive a second pre-charge signal.

21. The memory circuit as recited in claim 15, wherein the control terminal of each of the first and second pluralities of passgate transistors is a gate terminal, and wherein the gate terminal of each of the first and second pluralities of passgate transistors is coupled to receive a column select signal corresponding with it associated local bitline.

22. The memory circuit structure as recited in claim 15 further comprising:
a first keeper circuit, wherein the first keeper circuit is coupled to a lowest order one half of the first plurality of local bitlines; and
a second keeper circuit, wherein the second is coupled to a lowest order one half of the second plurality of local bitlines.

23. The memory circuit as recited in claim 22, wherein
a lowest order one half of the first plurality of local bitlines is coupled to a first intermediate bitline;
a highest order one half of the first plurality of local bitlines is coupled to a second intermediate bitline;

a lowest order one half of the second plurality of local bitlines is coupled to the second intermediate bitline; and the highest order one half of the second plurality of local bitlines is coupled to the first intermediate bitline.

24. The memory circuit as recited in claim 15, wherein the memory circuit is comprised in a read-only memory (ROM).

25. The memory circuit as recited in claim 15, wherein the memory circuit is comprised in a static random access memory (SRAM).

26. The memory circuit as recited in claim 15, wherein:
a lowest order one half of the first plurality of local bitlines is coupled to a first intermediate bitline;
a highest order one half of the first plurality of local bitlines is coupled to a second intermediate bitline;
a lowest order one half of the second plurality of local bitlines is coupled to the second intermediate bitline; and the highest order one half of the second plurality of local bitlines is coupled to the first intermediate bitline.

27. The memory circuit as recited in claim 25, wherein the first and second intermediate bitlines are coupled to the global bitline via a NAND gate.

* * * * *